(12) United States Patent
Ohtsu et al.

(10) Patent No.: US 7,731,430 B2
(45) Date of Patent: Jun. 8, 2010

(54) SUB-MOUNT FOR MOUNTING OPTICAL COMPONENT, MANUFACTURING METHOD THEREOF, AND LIGHT TRANSMISSION AND RECEPTION MODULE

(75) Inventors: Shigemi Ohtsu, Ashigarakami-gun (JP); Toshihiko Suzuki, Ashigarakami-gun (JP); Keishi Shimizu, Ashigarakami-gun (JP); Kazutoshi Yatsuda, Ashigarakami-gun (JP); Akira Fujii, Ashigarakami-gun (JP); Eiichi Akutsu, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 478 days.

(21) Appl. No.: 11/357,946

(22) Filed: Feb. 22, 2006

(65) Prior Publication Data

US 2007/0019899 A1    Jan. 25, 2007

(30) Foreign Application Priority Data

Jul. 25, 2005    (JP)    ............................ 2005-214936

(51) Int. Cl.
*G02B 6/36* (2006.01)

(52) U.S. Cl. ............................ 385/88; 385/14; 385/49; 385/89; 385/90; 385/91; 385/92; 385/94; 385/129; 385/130

(58) Field of Classification Search ............ 385/55–59, 385/53, 129–132, 14, 31, 88–94, 49
See application file for complete search history.

(56) References Cited

U.S. PATENT DOCUMENTS

| | | | |
|---|---|---|---|
| 4,735,677 A * | 4/1988 | Kawachi et al. | ............... 438/25 |
| 5,896,481 A * | 4/1999 | Beranek et al. | ............... 385/90 |
| 6,181,854 B1 * | 1/2001 | Kojima et al. | .................. 385/49 |
| 6,263,137 B1 * | 7/2001 | Yoneyama et al. | ............ 385/49 |
| 6,354,747 B1 * | 3/2002 | Irie et al. | ....................... 385/88 |
| 6,467,972 B2 * | 10/2002 | Setoguchi | ..................... 385/88 |
| 6,721,485 B1 * | 4/2004 | Nakamura et al. | .......... 385/143 |
| 6,837,627 B2 * | 1/2005 | Nakanishi et al. | ............. 385/92 |
| 7,029,607 B2 * | 4/2006 | Shimizu et al. | ............ 264/1.25 |
| 7,254,300 B2 * | 8/2007 | Nishie et al. | .................. 385/49 |
| 7,289,701 B2 * | 10/2007 | Lam et al. | ...................... 385/49 |
| 7,350,982 B2 * | 4/2008 | Ohtsu et al. | ................... 385/59 |
| 2006/0198569 A1 * | 9/2006 | Ohtsu et al. | .................... 385/14 |

FOREIGN PATENT DOCUMENTS

| | | |
|---|---|---|
| JP | A 5-114800 | 5/1993 |
| JP | A 2000-39530 | 2/2000 |
| JP | A 2000-39531 | 2/2000 |
| JP | A 2000-235127 | 8/2000 |
| JP | A 2005-321560 | 11/2005 |
| JP | A-2006-243467 | 9/2006 |

\* cited by examiner

*Primary Examiner*—Brian M. Healy
*Assistant Examiner*—Guy G Anderson
(74) *Attorney, Agent, or Firm*—Oliff & Berridge, PLC

(57) ABSTRACT

A sub-mount for mounting optical components includes a recess for mounting whose side wall is tapered. A light transmission and reception module includes the sub-mount for mounting optical component. The sub-mount is manufactured by forming a master mold of the sub-mount formed with projections and recesses including the recess for mounting of the sub-mount, applying liquid silicone rubber to the mater mold, curing the liquid silicone rubber to produce a mold for duplication, filling the curable material into the mold for duplication, curing the curable material, and separating the cured curable material from the mold for duplication.

24 Claims, 11 Drawing Sheets

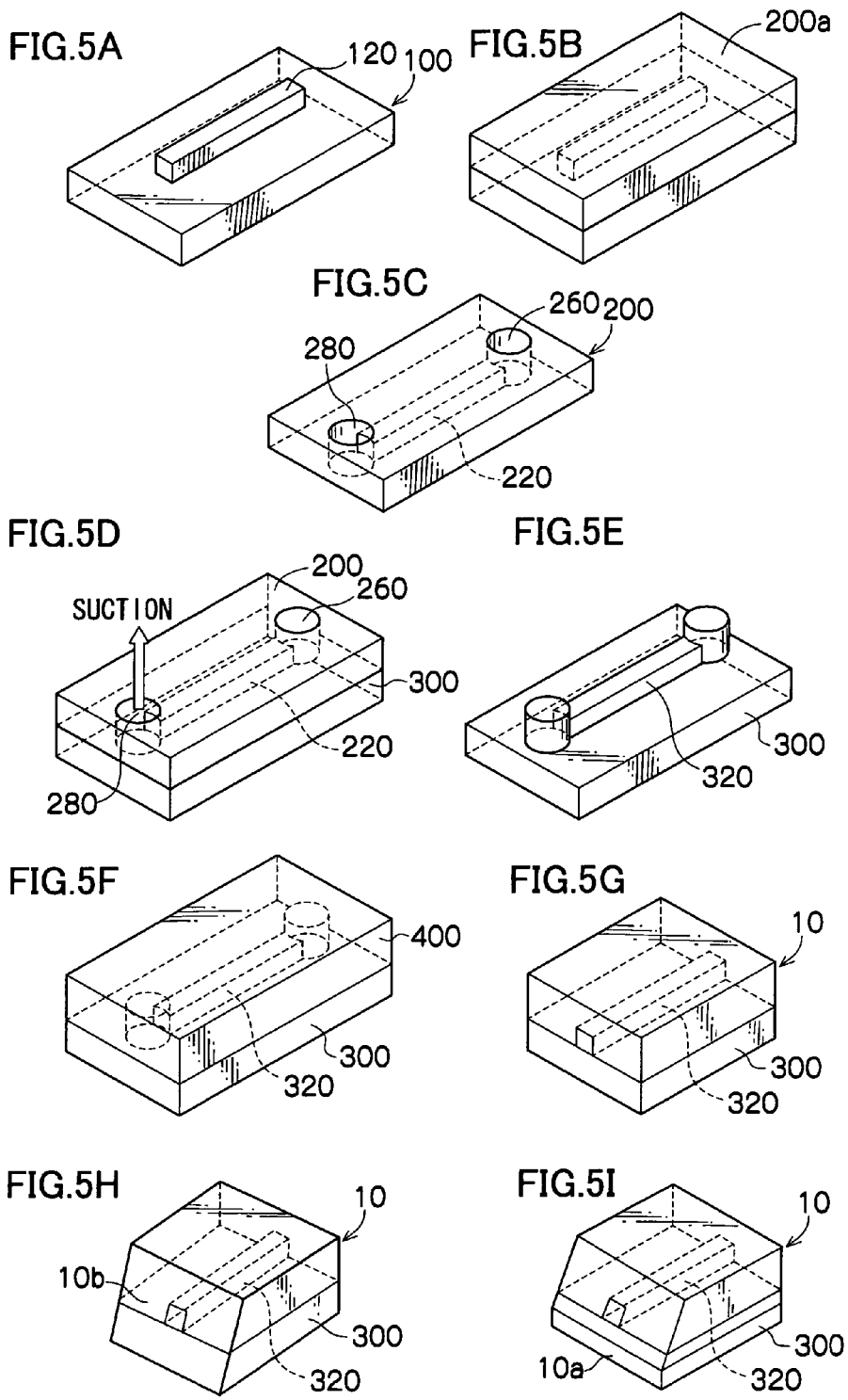

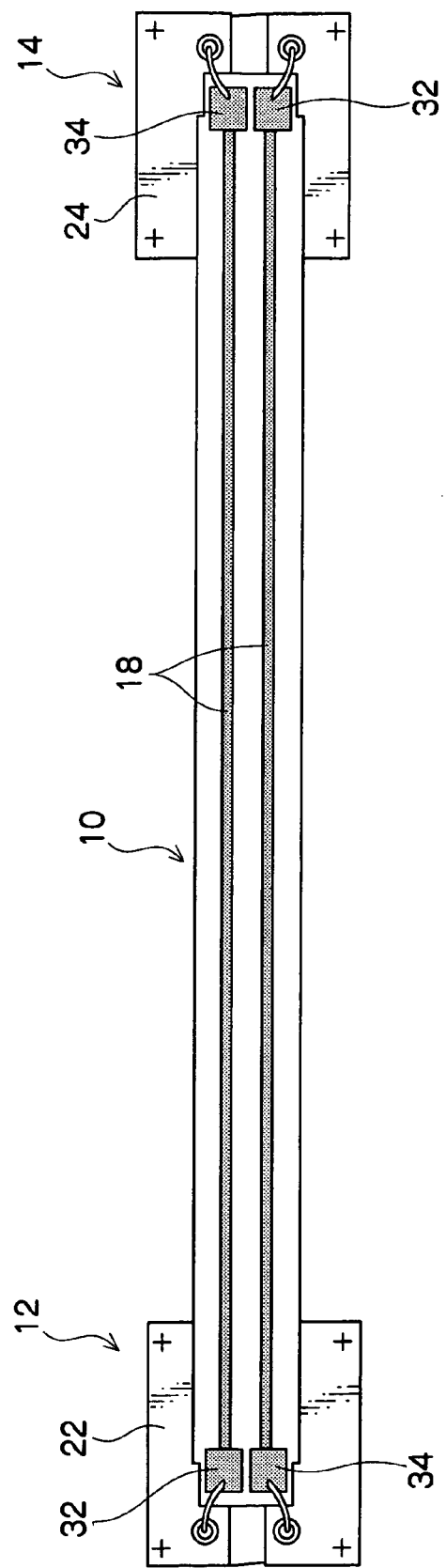

SUB-MOUNT FOR MOUNTING OPTICAL COMPONENT, MANUFACTURING METHOD THEREOF, AND LIGHT TRANSMISSION AND RECEPTION MODULE

CROSS-REFERENCE TO RELATED APPLICATION

This application claims priority under 35 USC 119 from Japanese patent document, No. 2005-214936, the disclosure of which is incorporated by reference herein.

FIELD OF THE INVENTION

The present invention relates to a sub-mount for mounting optical component, light transmission and reception modules, and manufacturing method of the sub-mount for mounting optical component, more specifically, relates to a sub-mount mounted inside a package of an optical device, a light transmission and reception module using the sub-mount, and a manufacturing method of the sub-mount.

DESCRIPTION OF THE RELATED ART

Recently, in IC technique or LSI technique, optical wiring between equipments, between boards in the equipments, or in a chip is given attention instead of the electrical wiring at high density to enhance the operating speed or integration degree.

In Japanese Patent Application Laid-Open No. 2000-39530, for example, an optical element including a light emitting element and a light detecting element in a core clad stacking direction of a macromolecular optical waveguide including the core and the clad surrounding the core, and further including an incident side mirror where light emitted from the light emitting element is coupled and a emission side mirror emitting the light to the light detecting element. In the publication, the optical element is disclosed in which the clad layer is formed into a concave shape at locations corresponding to the light paths from the light emitting element to the incident side mirror, and from the emission side mirror to the light detecting element, at where the light from the light emitting element and the light from the emission side mirror converge.

Further, in Japanese Patent Application Laid-Open No. 2000-39531, an optical element is disclosed in which light from a light emitting element is coupled at a core end surface of a macromolecular optical waveguide including the core and a clad surrounding the core. In the optical element, the end surface of the core is formed into a convex surface towards the light emitting element so that the light from the light emitting element is converged and a wave loss is suppressed.

Further, in Japanese Patent Application Laid-Open No. 2000-235127, an optoelectronic integrated circuit is disclosed in which the macromolecular optical waveguide circuit is directly assembled on the circuit integrating the electronic elements and optical elements.

When the above elements are packaged in an optical wiring and can be incorporated into a device, the assembling flexibility of the optical wiring can be increased. As a result, a light transmission and reception element with compact shape can be manufactured.

However, the methods proposed so far requires a mirror to be embedded to form a 90° return mirror, and requires positioning at high precision when laminating the waveguide and the light transmission and reception element, and thus the cost required for mounting becomes large.

A macromolecular optical waveguide module equipped with light emitting and detecting elements including a macromolecular optical waveguide film was disclosed by the present inventors (Japanese Patent Application Laid-Open No. 2004-139041, Japanese Patent Application FE04-04966). In the disclosure, an optical waveguide is duplicated with a mold and the macromolecular optical waveguide film includes a light path conversion mirror surface and an abutting surface on the same end. Further, a method of mounting by embedding the light emitting element and the light detecting element in a recess of a sub mount is contrived to facilitate mounting of these elements.

In Japanese Patent Application Laid-Open No. 5-114800 (1993), a method of causing vibration using ultrasonic to facilitate alignment is contrived when elements are embedded into a recess of sub-mount, but has a disadvantage in that a device becomes large.

An expensive device such as RIE is necessary to manufacture a sub-mount with precise shape. Further, a mounting device of high precision is necessary in order to accurately mount the elements into the recess of the high-precision processed sub-mount, and thus the mounting cost increases.

SUMMARY OF THE INVENTION

The present invention provides a sub-mount to easily and reliably mount the optical components at a satisfactory precision, a manufacturing method thereof, and a light transmission and reception module using the same.

The first embodiment of the present invention is a sub-mount comprising a recess for mounting to embed and mount an optical component, wherein a side wall of the recess for mounting is tapered.

The sub-mount of the invention has the tapered side wall of the recess for mounting, therefore, the optical component is embedded and mounted in the recess easily and reliably. Thus, the sub-mount of the invention excels in mass production with a low cost.

When the side wall of the recess for mounting is tapered, it means that an angle formed by a bottom surface and the side wall surface of the recess (an angle formed by the surfaces) exceeds 90 degrees. In other words, the bottom surface and the side wall surface form an angle exceeding 90 degrees so that an opening is greater than the bottom surface of the recess.

The second embodiment of the invention is a light transmission and reception module comprising an optical waveguide film formed with an optical waveguide, a light transmission section having a light emitting element and a sub-mount for holding the light emitting element and holding one of the end portions of the optical waveguide film on the sub-mount so that light emitted from the light emitting element is coupled with an incident end surface of the optical waveguide, and a light detecting section having a light detecting element and a sub-mount for holding the light detecting element and holding the other end portion of the optical waveguide film on the sub-mount so that light emitted from the exit end surface of the optical waveguide is detected by the light detecting element, wherein each sub-mount includes a recess for mounting to embed and mount an optical component and a side wall of the recess for mounting is tapered.

In the light transmission and reception module of the invention, the side wall of the recess for mounting to embed and mount the optical component is tapered, and thus it is allowed that the optical element serving as the optical component and the optical waveguide film are easily and reliably mounted to the sub-mount at high precision resulting in the module is excels in mass production at a low cost.

The third embodiment of the invention is a manufacturing method of a sub-mount for mounting an optical component comprising: producing a mold for duplication by making a master mold of the sub-mount by forming projections and recesses including a recess for mounting by performing anisotropic etching on a silicon monocrystal substrate having a (100) plane cut out on a surface, applying or pouring liquid silicone rubber into the master mold, and separating the cured silicone rubber from the master mold to obtain the mold for duplication; filling a curable material into the mold for duplication; curing the filled curable material; and separating the cured curable material from the mold for duplication.

According to the manufacturing method of the sub-mount for mounting an optical component, since the shape including the recess for mounting of the sub-mount is accurately copied to the mold for duplication, the sub-mount maintaining the shape at high precision can be produced easily.

BRIEF DESCRIPTION OF THE DRAWINGS

Embodiments of the present invention will be described in detail based on the following figures, wherein:

FIGS. 5A to 5I are views showing the manufacturing steps of the macromolecular optical waveguide film of the light transmission and reception modules according to the embodiment;

FIG. 8 is a view schematically showing a structure of the light transmission and reception module according to the present embodiment;

DETAILED DESCRIPTION OF THE INVENTION

Embodiments of the present invention will now be described in detail with reference to the drawings.

Sub-Mount and Manufacturing Method Thereof

The sub-mount of the invention includes a recess for mounting with tapered side walls to embed and mount optical components.

The sub-mount of the invention can be obtained by a manufacturing method comprising the steps of (1) a mold production step for producing a mold for duplication having projections and recesses for copying the surface configuration of a sub-mount, (2) a filling step for filling the produced mold with curing material, (3) a curing step for curing the applied curing material, and (4) a releasing step for separating a copied sub-mount from the mold.

The method of producing the mold for duplication is comprised of curing a liquid silicone rubber on a master mold (a master plate of the sub-mount), that is, a manufacturing method of performing anisotropic etching on a silicon monocrystal substrate having a (100) plane cut out on a surface to produce a master mold formed with projections and recesses including a recess for mounting for copying the surface configuration of the sub-mount; applying or pouring liquid silicone rubber to the produced master mold and curing the liquid silicone rubber; and separating the mold for duplication from the master mold. This method is different from "the stamper method" duplicating the sub-mount with the master mold directly using ultraviolet curable resin or thermosetting resin.

Figure 1A:
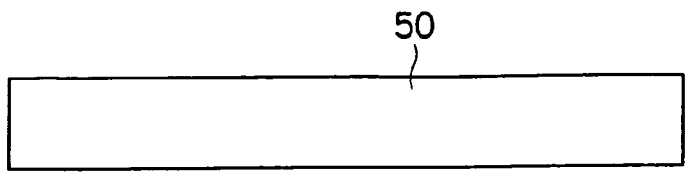
FIGS. 1A to 1F are process charts showing the steps of a manufacturing method of a sub-mount of the invention.
Figure 1B:
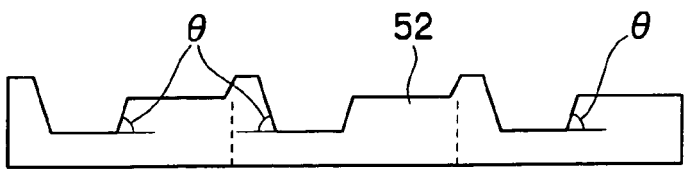

The overall picture of the "duplication method using silicone resin" will now be explained with reference to FIGS. 1A to 1F. FIG. 1A shows a silicon substrate 50 (silicon monocrystal substrate) with a (100) plane cut out on a surface. The silicon substrate 50 is masked using a resist, and anisotropic etching can be performed by using TMAH (tetramethylammonium hydroxide). Projections and recesses are formed through anisotropic etching in which the (111) planes having a constant angle (acute angle $\theta$) of 54.74° with respect to the substrate surface are formed. The (111) planes become the surfaces of the tapered side walls (FIG. 1B). Thus, the master plate 52 (master mold) of the sub-mount is formed with projections and recesses including the recess for mounting. The projections and recesses for a plurality of sub-mounts are formed on the master plate 52, and plural sub-mounts are duplicated all at once using such master plate.

Figure 1C:
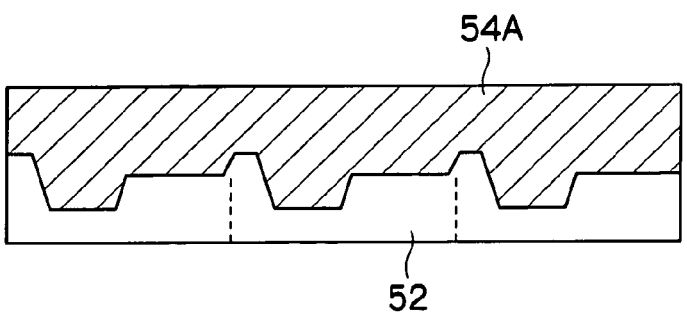
Figure 1D:
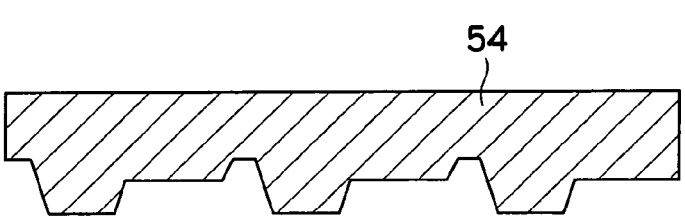

Liquid silicone rubber is applied or poured into the projection and recess formed surface of the master plate 52, and cured (see FIG. 1C). Then the silicone resin layer 54A is peeled off, and a silicone resin mold 54 having projections and recesses is obtained, in which projections and recesses copy the surface configurations of the sub-mount (see FIG. 1D). Due to the adhering and releasing properties of the liquid silicone rubber, the projections and the recesses of the master plate 52 are copied accurately. These steps correspond to the mold production step.

Figure 1E:
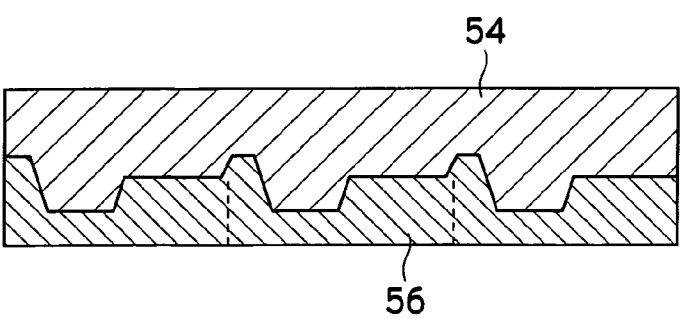
Figure 1F:
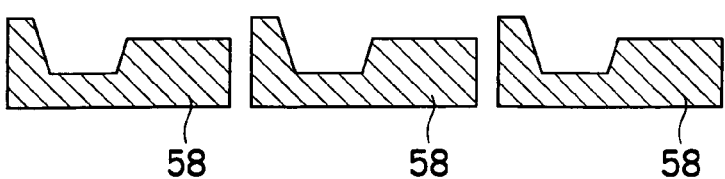

The mold 54 is filled with ultraviolet curable resin and cured by ultraviolet irradiation (see FIG. 1E). These steps correspond to the filling step and the curing step. Then, by separating the cured resin layer 56 from the mold 54, the projections and the recesses of the sub-mount surface are reproduced. This step corresponds to the releasing step. By dicing this duplicate (not shown) into individual sub-mount, sub-mounts 58 of ultraviolet cured resin having projections and recesses on the surface are obtained (see FIG. 1).

The side walls of the projections and recesses including the recess for mounting have tapered shape, and the recess is configured with the opening being larger than the bottom surface.

The principal steps of the duplication method using the silicone resin are more specifically described below.

(Production of Master Plate (Master Mold))

In the above description, an example of producing the master plate of the sub-mount using anisotropic etching of the silicon monocrystal substrate is explained, but other than the silicon substrate, the monocrystal substrate such as GaP, InP, GaAs and the like may be used for the material of the master plate. However, Si (100) substrate is suitable in terms of cost.

(Production of Mold)

In the duplication method using silicone resin, as mentioned above, liquid silicone rubber is applied or poured into the projection and recess formed surface of the produced master plate, dried if necessary, and cured, and a silicone resin layer is formed. By separating the silicone resin layer from the master plate, a mold copying the surface configuration of the sub-mount is produced.

The thickness of the silicone resin layer is properly determined in consideration of handling convenience of the mold, but in general it is suitably set to be about 0.1 to 50 mm. Preferably, the master plate should be coated in advance with releasing agent or the like to facilitate releasing from the mold.

The liquid silicone rubber is curing organopolysiloxane, which becomes silicone rubber after curing, and the term "liquid" includes paste or viscous substances. The liquid silicone rubber preferably contains methyl siloxane group, ethyl siloxane group, or phenyl siloxane group in its molecule. Among liquid silicone rubber materials, liquid dimethyl siloxane rubber (polydimethyl siloxane: PDMS) is particularly preferable from the viewpoint of adhesion, releasing property, strength and hardness.

The liquid silicone rubber is excellent in both adhesion and separation, which are contradictory properties, and has a capability of copying fine configuration. Accordingly, the mold using silicone rubber is capable of copying the master plate at high precision, and it is easy to separate the mold from ultraviolet curable resin for forming the sub-mount described later. Advantages of liquid silicone rubber mold include sufficient mechanical strength and dimensional stability as mold (which is to be used repeatedly), and stiffness (hardness) for retaining the projected and recessed configurations. From this mold, therefore, sub-mounts retaining the shape at high precision can be reproduced very easily.

The liquid silicone rubber is preferred to be of two-pack type used together with hardening agent. The addition type liquid silicone rubber is preferred because it is cured uniformly both at the surface and the inside in a short time, free from byproducts or produces few byproducts, is excellent in releasing property and small in shrinkage rate. As required, various additives may be used in the liquid silicone rubber.

Since the liquid silicone rubber can be applied or poured on the surface of the master plate and the projections and the recesses formed on the master plate must be copied accurately, the viscosity is preferred to be less than a certain level. The viscosity of the liquid silicone rubber is preferred to be about 500 mPa·s to 7000 mPa·s, or more preferably about 2000 mPa·s to 5000 mPa·s. For adjusting the viscosity, a solvent may be added slightly so as not to express adverse effects of the solvent.

The surface energy of the mold is 10 dyn/cm to 30 dyn/cm, preferably 15 dyn/cm to 24 dyn/cm, from the viewpoint of adhesion to the resin. The surface energy can be analyzed by measuring the contact angle between solid and liquid, and hence it is measured by a specified contact angle measuring apparatus. Share rubber hardness of the mold is 15 to 80, preferably 20 to 60, from the viewpoint of patterning performance, retaining of the recess shape and separation. Share rubber hardness can be measured by using spring type rubber durometer for measuring an amount of deformation when a surface of the object is pushed by a needle and made deformed. Surface roughness of mold (maximum height: Ry) is set to be 0.2 μm or less, preferably 0.1 μm (100 nm) or less, from the viewpoint of patterning performance. Surface roughness Ry is a value expressing a maximum height defined by the difference of a maximum value and a minimum value of roughness curve, and can be measured by probe type film thickness gauge.

The mold is preferred to be light transmittable in ultraviolet ray region and/or visible ray region. When the mold is light transmittable in visible ray region, the state of filling the mold with the resin can be observed and completion of filling is easily confirmed. When the mold is light transmittable in ultraviolet ray region, ultraviolet curing is achieved by making ultraviolet transmit through the mold. The transmittance of the mold in ultraviolet ray region (250 nm to 400 nm) is preferred to be 80% or more.

(Duplication of Sub-Mount)

The mold copying the surface configuration of the sub-mount is filled with ultraviolet curable resin for forming a sub-mount, the applied resin is cured, and the cured resin layer is separated from the mold, so that a sub-mount formed projections and recesses on the surface can be copied.

As the ultraviolet curable resin for forming a sub-mount, a resin of high heat resistance is preferred, and epoxy based and polyimide based UV curable resins are preferably used. Also, monomer, oligomer, or mixture of monomer and oligomer of ultraviolet curing type may be preferably used.

The ultraviolet curable resin is required to be sufficiently low in viscosity so as to fill up the projections and recesses of the mold. The viscosity of ultraviolet curable resin is preferably 10 mPa·s to 2000 mPa·s, more preferably 20 mPa·s to 1000 mPa·s, and most preferably 30 mPa·s to 500 mPa·s.

To reproduce the projections and recesses formed on the master plate at high precision, it is required that the volume change is small before and after curing of the ultraviolet curable resin. The volume change is preferred to be 10% or less, or more preferably 6% or less. It is preferred to avoid lowering the viscosity by using a solvent because the volume change before and after curing becomes large.

To reduce volume change (shrinkage) after curing of the ultraviolet curable resin, a polymer may be added to the ultraviolet curable resin. The polymer to be added is preferably compatible with the ultraviolet curable resin and dose not have adverse effects on the resin refractive index, elasticity and light-transmitting properties thereof. By adding the polymer, not only the volume change can be decreased, but also the viscosity or glass transition point of the cured resin can be effectively controlled at advanced level. The polymer includes acrylic system, methacrylic acid system, epoxy system, and many others.

To cure the ultraviolet curable resin, light is emitted from ultraviolet ray lamp, ultraviolet ray LED, UV irradiation apparatus, in an ultraviolet region (250 nm to 400 nm).

Light Transmission and Reception Module

Figure 2:
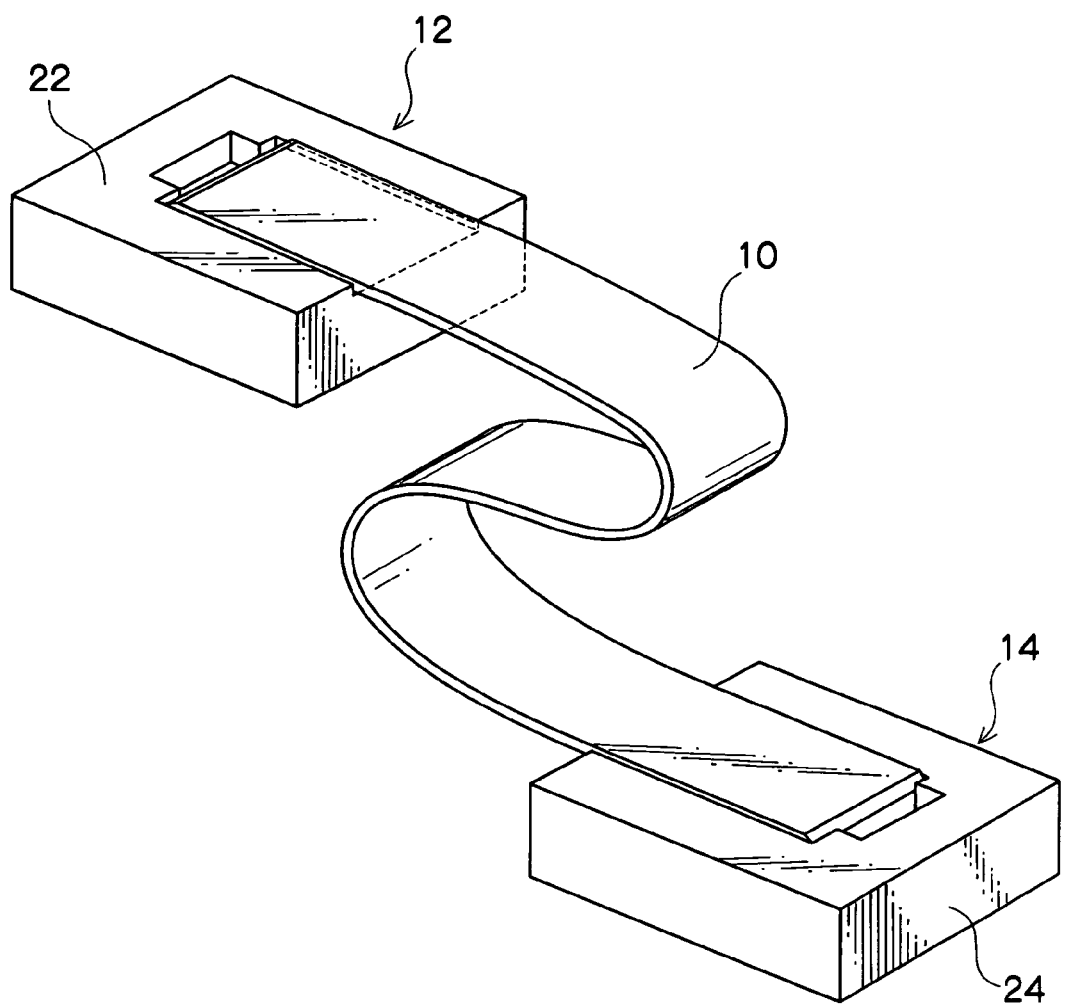
FIG. 2 is a schematic configuration view of a light transmission and reception module according to one embodiment.

FIG. 2 is a schematic structural diagram of light transmission and reception module in the embodiment. As shown in FIG. 2, the light transmission and reception module is composed of a belt-shaped macromolecular optical waveguide film 10 and optical transmission and reception sections 12, 14 for transmitting and receiving an optical signal through an optical waveguide formed in the macromolecular optical waveguide film 10.

The optical transmission and reception section 12 has a sub-mount 22, and one end of the macromolecular optical waveguide film 10 is held on the sub-mount 22. The optical transmission and reception section 14 has a sub-mount 24, and the other end of the macromolecular optical waveguide film 10 is held on the sub-mount 24.

Figure 3B:
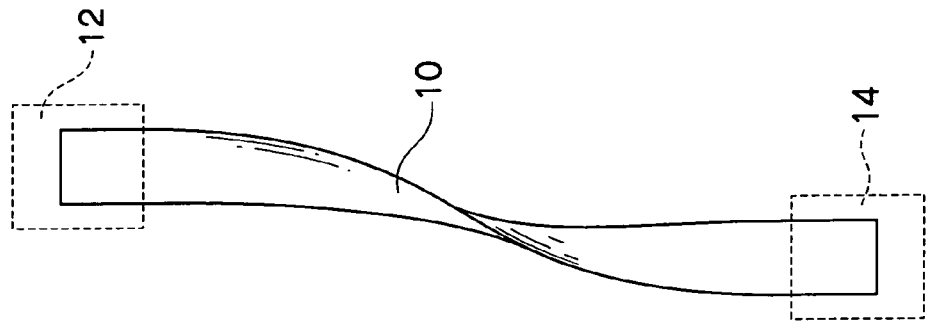
FIG. 3A and FIG. 3B are views showing a follow-up property to deformation of the light transmission and reception modules according to the embodiment.
Figure 3A:
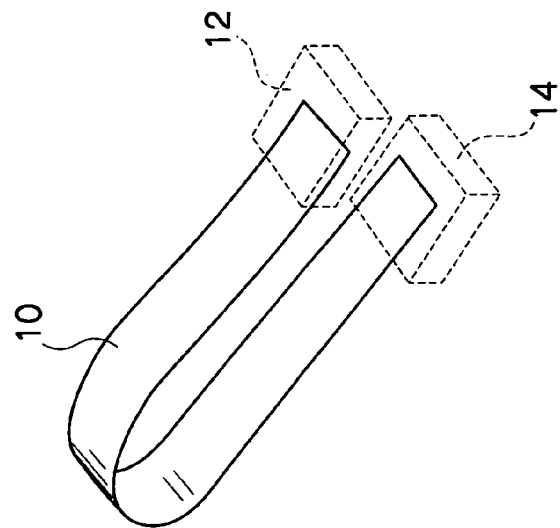

The macromolecular optical waveguide film 10 consists of a transparent resin film having flexibility, and has a follow-up property to deformation such as "bend" or "twist", as shown in FIG. 3A and FIG. 3B. Thus, even if the film is in a deformed state, the optical signal transmitted from the optical transmission and reception section 12 is guided through the optical waveguide formed in the macromolecular optical waveguide film 10 and received by the optical transmission and reception section 14. The macromolecular optical waveguide film 10 preferably has a flexibility of a curvature radius of 3 mm or less. The curvature radius is a value that, when the microscopic portion of a curve formed on the inner side of the film when the film is bent approaches a circle, indicates the length of the radius of such circle, and the acceptable value thereof is measured according to ASTM D-2176. The resin materials used for the macromolecular optical waveguide film 10 will be hereinafter explained.

The macromolecular optical waveguide film 10 is preferred to have a thickness in a range of 50 μm to 300 μm in order to enhance the follow-up property to deformation, and a more preferable range is 100 μm to 200 μm. For the same reason, the width of the film is preferred to be in a range of 0.5 mm to 10 mm, or more preferably 1 mm to 5 mm.

Macromolecular Optical Waveguide Film.

Figure 4A:
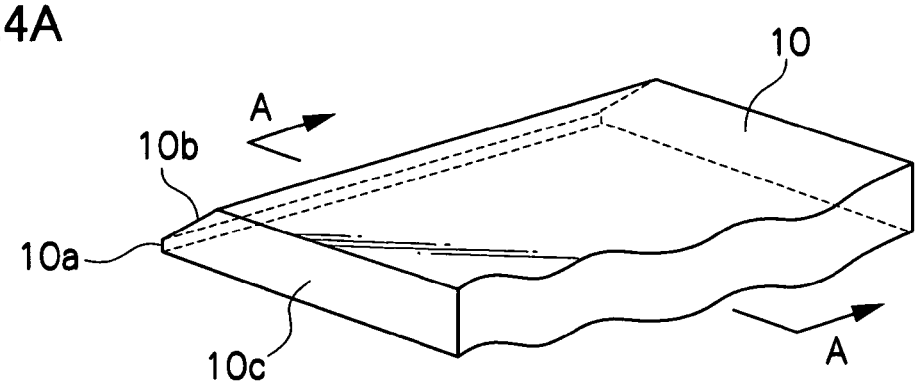
FIG. 4A is a perspective view of an end portion of a macromolecular optical waveguide film of the light transmission and reception module according to the embodiment.
Figure 4B:
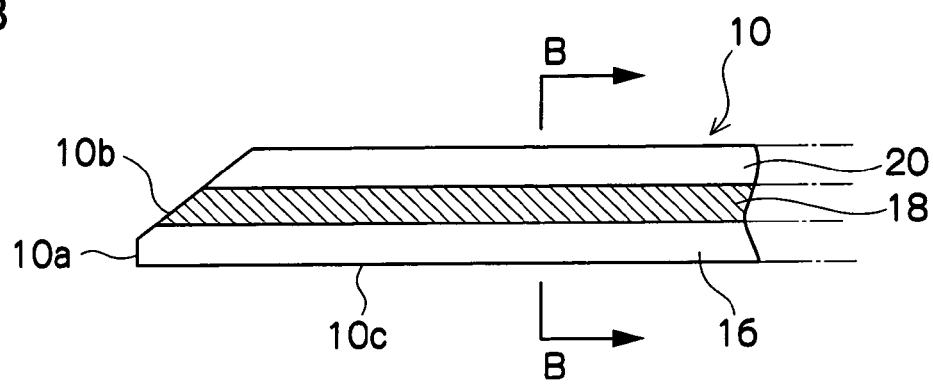
FIG. 4B is a sectional view taken along A-A of FIG. 4A.
Figure 4C:
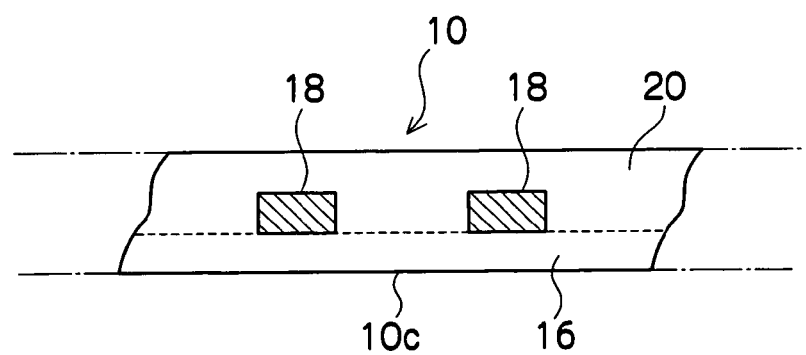
FIG. 4C is a sectional view taken along B-B of FIG. 4B.

With referring to FIGS. 4A to 4C, the configuration of the macromolecular optical waveguide film 10 will be described. FIG. 4 is a perspective view of an end portion of the macromolecular optical waveguide film 10, FIG. 4B is a sectional view of A-A (section along optical axis of optical waveguide) of FIG. 4A, FIG. 4C is a sectional view of B-B of FIG. 4B.

As shown in the drawing, the macromolecular optical waveguide film 10 is composed of square cores 18 extending in film length direction, and cladding 16 and 20 surrounding the cores 18. In the macromolecular optical waveguide film 10, plural cores 18 are disposed parallel in the film width direction and plural optical waveguides are formed in the film. In this example, two optical waveguides are formed in the film 10.

At the end of the macromolecular optical waveguide film 10, a mirror 10b is disposed at an angle of 45 degrees to the optical axis of optical waveguide. The mirror 10b functions as optical path converter for converting the optical path of the light guided in the optical waveguide. That is, the light guided in the optical waveguide has an optical path thereof changed by 90 degrees on the mirror 10b and is emitted from the film side 10c of the light incident and exit surface. The leading end of the cladding 16 forming the mirror 10b is cut off and an abutting surface 10a orthogonal to the optical axis of optical waveguide is formed. The abutting surface 10a is a surface abutting against the sub-mount and is utilized in positioning on the sub-mount at the time of mounting.

The macromolecular optical waveguide film 10 can be manufactured, for example, in the following steps (1) to (6): (1) a step of preparing a mold formed of a cured layer of curable resin for forming a mold, having recesses corresponding to the optical waveguide core portions and two or more through-holes each penetrating through both ends of the respective recess, (2) a step of tightly adhering a plastic film base material for cladding to the mold, the plastic film is capable of contacting tightly with the mold, (3) a step of filling the through-hole at one end of the respective recess of the mold with a curable resin for forming a core and evacuating and sucking from the through-hole at the other end of the respective recess resulting in each recess of the mold filled with the curable resin, (4) a step of curing the filled curable resin for forming a core, and separating the mold from the plastic film base material for cladding, (5) a step of forming a cladding layer on the plastic film base material on which the cores are formed, and (6) a step of forming the 45-degree mirror and the abutting surface at the end of the obtained macromolecular optical waveguide film.

The manufacturing processes of the above mentioned macromolecular optical waveguide film will now be further explained in detail with reference to FIG. 5A to FIG. 5I. To simplify the explanation, that in which one optical waveguides is arranged will be explained. FIG. 5A shows a master plate 100 and numeral 120 denotes a projection corresponding to the core of the optical waveguides. The curable resin for forming a mold is applied or poured on the projection formed surface of the master plate 100 and then cured (refer to FIG. 5B). In FIG. 5B, 200a denotes a curable resin layer. Thereafter, when the curable resin layer 200a is peeled off, the curable resin layer 200a formed with a recess is obtained (not shown). The through-holes 260 and 280 communicating to the recess 220 are formed in the curable resin layer 200a by punching etc. both ends of the recess to obtain a mold 200 (refer to FIG. 5C).

As shown in FIG. 5D, a plastic film base material for cladding 300 is adhered to the mold. A curable resin for forming a core is poured into the through-hole 260 at the one end of the mold recess 220. The mold recess 220 is filled with the curable resin for forming a core by evacuating and sucking from the through-hole 280 at the other end of the mold recess 220. After the resin is cured, the mold is parted and a core 320 is formed on the plastic film base material for cladding 300 as shown in FIG. 5E.

Forming a cladding (upper cladding layer) 400 (see FIG. 5F), the resin portions cured inside the through-holes 260 and 280 are cut off by a dicer or the like, and a macromolecular optical waveguide film 10 is obtained (see FIG. 5G).

Finally, using a dicing saw having a 45-degree angle blade, the end of the macromolecular optical waveguide film 10 is diced, and a 45-degree mirror 10b is formed at the end of the film 10 (see FIG. 5H). Further, using the dicing saw, the leading end of the 45-degree mirror is cut off at right angle with respect to the longitudinal direction of macromolecular optical waveguide film by a specified length including only the cladding portion, whereby an abutting surface 10a is formed (see FIG. 5I).

The each step of forming the macromolecular optical waveguide film 10 is specifically explained below.

(1) A Step of Preparing a Mold

Preferably, the mold is prepared by using a master plate having projecting portions corresponding to the optical waveguide cores but it is not limited to this. A method of using a master plate is explained below.

(Production of Master Plate)

To produce the master plate having projecting portions, a conventional method, for example, photolithography can be used without any limitation. Also the method previously proposed by the present inventors for producing a macromolecular optical waveguide by electrodeposition or photoelectrodeposition (Japanese Patent Application No. 2002-10240) is also applicable for production of the master plate.

The size of the projecting portions corresponding to the optical waveguide formed in the master plate is determined properly depending on the application of the macromolecular optical waveguide. For example, in the case of optical waveguide for single mode, a core of about 10 μm square is generally used, or in the case of optical waveguide for multimode, a core of about 50 to 100 μm square is used, and depending on the applications, an optical waveguide having much larger core of about hundreds of μm may be used.

(Production of Mold)

As an example of production of mold, a layer of curable resin for forming a mold is formed on the projecting portion formed surface of the master plate produced as mentioned above by applying or pouring curable resin for forming a mold thereon. The layer is dried and cured as required, then the cured resin layer is separated from the master plate and a die having recesses corresponding to the projecting portions are formed. The through-holes each communicating from one end to the other end of the recess are formed in the die. The through-holes can be formed by punching the die in a specified shape. Even if the through-holes are formed by punching, the contact tightness between the mold and the film base material for cladding is excellent so that no gap to the film base material for cladding is formed except for the recess of the mold. Accordingly, the curable resin for forming a core will not permeate into other portion than the recesses.

The thickness of the die (resin cured layer) is properly determined in consideration of handling capability of the mold, but generally it is suitably set to be about 0.1 to 50 mm. Preferably, the master plate should be preliminarily coated with releasing agent or the like to facilitate releasing from the mold.

The through-hole provided at a supply side of the curable resin for forming a core functions as a reservoir for liquid (curable resin for forming a core). The through-hole provided at a discharge side of the resin is used for evacuation and suction to evacuate the recess so that the recess is filled with the resin. The shape and size of the supply side through-hole are not particularly specified as far as the through-hole communicates with the supply side of the recess and functions as the liquid reservoir. The shape and size of the discharge side through-hole are also unlimited particularly as long as the through-hole communicates with the discharge end of the recess and can be used for evacuating and sucking.

Since the supply side through-hole functions as the reservoir for the curable resin for forming a core, a section of the through-hole is preferably formed to be made larger at the side contacting with the base material for cladding and smaller as away from the base material, so that it is easier to separate the mold and base material after filling the recess with the curable resin for forming a core and curing. The sectional configuration of the discharge side through-hole is not particularly specified as the discharge side through-hole does not function as the reservoir.

As other example of producing the mold, the master plate is provided not only with projecting portions corresponding to the optical waveguide cores but also with projecting portions for forming through-holes (the height of the projecting portions are higher than the thickness of the cured layer of curable resin for forming a mold), and the curable resin for forming a mold is applied to the master plate so that the projecting portions for forming the through-holes poke through the resin layer. After the resin layer is cured, the cured resin layer is separated from the master plate.

The curable resin for forming a mold is required to have appropriate properties, including ease of peeling of the cured matter from the master plate, sufficient mechanical strength and dimensional stability as mold (to be used repeatedly), stiffness (hardness) for retaining the recess shape, and adhesion to the film base material for cladding. As required, various additives may be added to the curable resin for forming a mold.

The curable resin for forming a mold can be applied or poured to the surface of the master plate and is required to copy accurately the projecting portions corresponding to the individual optical waveguide cores formed on the master plate. Therefore, it is preferred to have viscosity below a certain limit, for example, about 500 to 7000 mPa·s. (The curable resin for forming a mold used in the invention includes a material becoming elastic rubber like body after curing.) For control of viscosity, a solvent may be added slightly so as not to cause adverse effects of the solvent As the curable resin for forming a mold, a curable organopolysiloxane, which becomes silicone rubber (silicone elastomer) or silicone resin after curing is preferably used from the viewpoint of releasing property, mechanical strength and dimensional stability, hardness and adhesion with base materials for cladding as stated above. The curing organopolysiloxane is preferred to contain methyl siloxane group, ethylene siloxane group, or phenyl siloxane group in its molecule.

The curing organopolysiloxane may be either one-pack type or two-pack type to be used together with hardener, or may be either hot curing type or cold curing type (for example, cured by moisture in air). Or other hardener (ultraviolet curing agent) may be also used.

The curable organopolysiloxane is preferred to become silicone rubber after curing. So-called liquid silicone rubber can be used (the term "liquid" includes paste or highly viscous substances herein) and the two-pack type to be used together with hardener is preferred. Above all, the addition type liquid silicone rubber is especially preferred because it is cured in short time uniformly both on surface and inside thereof, free from byproducts or produce few byproducts, and excellent in releasing property and small in shrinkage rate.

Among liquid type silicone rubbers, liquid dimethyl cyclohexane rubber is particularly preferable from the viewpoint of adhesion, separation, strength and hardness. The cured substance of liquid dimethyl cyclohexane rubber is generally low in refractive index of about 1.43, and a mold made from this substance can be preferably used as cladding layer directly, which does not cause separation from the base material for cladding. In this case, it is required to have proper means to prevent peeling of applied core forming resin and base material for cladding from the mold.

The viscosity of liquid silicone rubber is preferably about 500 to 7000 mPa·s, or more preferably about 2000 to 5000 mPa·s, from the viewpoint of accurate copying of projecting portions corresponding to the optical waveguide cores and the position regulating portions of the power supply wire, ease of defoaming by limiting entry of foams, and obtaining mold size of several millimeters in thickness.

A surface energy of the mold is in a range of 10 dyn/cm to 30 dyn/cm, preferably 15 dyn/cm to 24 dyn/cm from the viewpoint of the adhesion with the base material film. The surface energy is measured by a method of measuring a critical surface tension using a Zisman method. Share rubber hardness of the mold is 15 to 80, or preferably 20 to 60 from the viewpoint of profiling performance, maintenance of the recess shape and separation. The share rubber hardness can be measured according to JIS K 6253 by using a durometer.

A surface roughness of the mold (an arithmetic mean roughness Ra) is 0.2 μm or less, or preferably 0.1 μm or less from the viewpoint of profiling performance. The arithmetic mean roughness Ra can be measured according to JIS B 0601.

The mold is preferred to be light transmittable in ultraviolet ray region and/or visible ray region. When the mold is light transmittable in visible ray region, positioning is easier when adhering the mold to the film base material for cladding at step (2) below, and filling of mold recess with curable resin for forming a core can be observed at step (3) so that completion of filling can be easily known.

When the mold is light transmittable in ultraviolet ray region, ultraviolet curing is to be achieved by transmitting ultraviolet through the mold in case that ultraviolet curable resin is used to form a core. Preferably, the transmittance of the mold in ultraviolet ray region (250 nm to 400 nm) is 80% or more.

The curable organopolysiloxane, in particular, liquid silicone rubber which becomes silicone rubber after curing is excellent in both of the contradictory properties of adhesion and separation with respect to the film base material for cladding and has a capability of copying nano configuration, and also works to prevent entry of liquid when silicone rubber and cladding base material are adhered.

As the mold using such silicone rubber copies the master plate accurately and adheres to the cladding base material, it fills only the recess between the mold and cladding base material efficiently with the core forming resin, and the mold can be separated easily from the cladding base material. Therefore, macromolecular optical waveguides retaining the configurations thereof at high precision can be produced very easily.

(2) A Step of Tightly Adhering a Plastic Film Base Material for Cladding to the Mold Since an optical device (a light transmission and reception module) produced from the macromolecular optical waveguide of the invention is used in optical wiring in various layers, the material of the plastic film base material for cladding is properly selected in consideration of refractive index, light permeability and other optical characteristics, mechanical strength, heat resistance, adhesion with mold, flexibility and others, depending on the applications of the optical device.

Examples of the film include alicyclic acrylic resin film, alicyclic olefin resin film, triacetic cellulose film, and fluorine containing resin film. The refractive index of film base material is preferably 1.55 or less, or more preferably 1.53 or less, in order to keep enough difference in refractive index from the core.

The alicyclic acrylic resin film is, for example, OZ-1000, OZ-1100 (Hitachi Chemical Co., Ltd.) manufactured by introducing tricyclodecane or other alicyclic hydrocarbon in ester substituent.

The alicyclic olefin resin film is one having norbornene configuration in the main chain, and one having norbornene configuration in the main chain and having polar group such as alkyl oxycarbonyl group (alkyl group having 1 to 6 carbon atoms or cycloalkyl group) in the side chain. Above all, the alicyclic olefin resin having norbornene configuration in the main chain and having polar group such as alkyloxycarbonyl group in the side chain as mentioned above is particularly suited to production of optical waveguide sheet of the invention because it is excellent in optical characteristics, having low refractive index (refractive index being about 1.50, assuring a sufficient difference in refractive index between core and cladding) and high light permeability, excellent in adhesion to the mold, and excellent in heat resistance.

A thickness of the film base material is properly selected in consideration of flexibility, rigidity and ease of handling, and is generally about 0.1 mm to 0.5 mm.

(3) A Step of Filling a Curable Resin for Forming a Core in the Recess of the Mold At this step, the through-hole provided at the supply side of the resin is filled with curable resin for forming a core, and by evacuating and sucking through the through-hole provided at the discharge side of the resin, the gap (i.e., the recess of the mold) formed between the mold and the film base material for cladding is filled with the resin. By evacuating and sucking, the adhesion of the mold and the film base material for cladding is enhanced, and entry of foams can be avoided. For evacuating and sucking, a suction pipe connected to a pump is inserted into the through-hole at the discharge side.

The curable resin for forming a core includes resins of radiation curing type, electron curing type and heat curing type, and above all the ultraviolet curable resin and thermosetting resin are preferably used. As the ultraviolet curable resin and thermosetting resin for forming a core, ultraviolet curing type and thermosetting type monomer, oligomer, or mixture of monomer and oligomer may be preferably used. Ultraviolet curable resins of epoxy system, polyimide system, and acrylic system may also be preferably used.

The curable resin for forming a core is filled in gaps (the recesses of mold) formed between the mold and the film base material by capillarity, and the curable resin for forming a core is required to be sufficiently low in viscosity for realizing such filling. Therefore, the viscosity of the curable resin is 10 mPa·s to 2000 mPa·s, preferably 20 mPa·s to 1000 mPa·s, or more preferably 30 mPa·s to 500 mPa·s.

Besides, in order to reproduce the original shape of the projecting portion corresponding to the optical waveguide core formed on the master plate at high precision, it is important that the volume change is small before and after curing of the curable resin. For example, decrease in volume leads to conduction loss. Therefore, the curable resin for forming a core is desired to be small in volume change as far as possible, for example, 10% or less, or preferably 6% or less. It is recommended to avoid lowering of viscosity by using a solvent as the volume change becomes large before and after curing.

To reduce the volume change (shrinkage) after curing of the resin, a polymer may be added to the resin. Such a polymer is preferred as being compatible with curable resin for forming a core, not having adverse effects on the resin refractive index, elasticity or permeability. By adding the polymer, not only the volume change can be decreased, but also it is effective to control the viscosity or glass transition point of the cured resin at an advanced level. The polymer includes acrylic system, methacrylic system, epoxy system, and many others.

The refractive index of the cured matter of curable resin for forming a core is required to be larger than that of the film base material as the cladding (including the cladding layer in step (5) below), and is 1.50 or more, preferably 1.53 or more. The difference in refractive index between the cladding (including the cladding layer in step (5) below) and the core is 0.01 or more, preferably 0.03 or more.

(4) A Step of Curing the Applied Resin for Forming a Core and Separating the Mold from the Film Base Material for Cladding At this step, the applied curable resin for forming a core is cured. To cure the ultraviolet curable resin, ultraviolet lamp, ultraviolet LED, UV irradiation equipment or the like is used, and to cure the thermosetting resin, it is heated in an oven or the like.

The mold used at steps (1) to (3) may be directly used as the cladding layer as far as the conditions such as refractive index are satisfied, and in such a case, separation of the mold is not required. In this case, it is preferred to treat the mold in ozone in order to enhance the adhesion between the mold and core material.

(5) A step of Forming a Cladding Layer on the Plastic Film Base Material for Cladding A cladding layer is formed on the film base material on which the cores are formed. The cladding layer to be used may be the film base material for cladding used in above step (2), a layer formed by applying and curing a curable resin for cladding, and a macromolecular film obtained by applying and drying a solvent solution of macromolecular membrane. As the curable resin for cladding, ultraviolet curable resin or thermosetting resin is used preferably, and for example, monomer, oligomer or mixture of monomer and oligomer of ultraviolet curing type or thermosetting type may be used.

To reduce a volume change (shrinkage) after curing of the resin, the resin may be blended with a polymer (for example, methacrylic system, epoxy system), which is compatible with the resin and does not have adverse effects on resin refractive index, elasticity or permeability.

When using a film as cladding layer, an adhesive may be used. The refractive index of the adhesive is desired to be closer to the refractive index of the film. As the adhesive, the ultraviolet curing type resin or thermosetting resin is used preferably. For example, monomer, oligomer or mixture of monomer and oligomer of ultraviolet curing type or thermosetting type may be used. To reduce the volume change (shrinkage) after curing of ultraviolet curable resin or thermosetting resin, the same type polymer added to the cladding layer may be used.

The refractive index of the cladding layer is desired to be 1.55 or less, preferably 1.53 or less in order to assure a sufficient difference in refractive index from the core. From the viewpoint of entrapping the light, the refractive index of the cladding layer is preferred to be similar to the refractive index of the film base material.

(6) A Step of Forming a 45-degree Mirror and an Abutting Surface on an End Surface of the Obtained Macromolecule Optical Waveguide Film The obtained macromolecular optical waveguide film is constituted so that the 45-degree mirror and the abutting surface are formed on the film end surface by using, for example, a dicing saw. The core portion is exposed from the mirror.

Since the plastic film base material exhibits favorable adhesion to the mold, no gap except for the recess configuration formed in the mold is allowed between the mold and the cladding base material without fixing them by using special means but adhering the plastic film base material for cladding tightly to the mold. Accordingly, the curable resin for curing a core can be provided only in the recess.

Therefore, the manufacturing process is extremely simplified and the macromolecular optical waveguide film can be manufactured at an extremely low cost.

In this manufacturing method, through-holes are provided in the mold and the discharge side of the recess of the mold is evacuated and sucked through the through-holes so that the adhesion of the mold and the film base material is further enhanced, and entry of foams can be avoided. Further, although performing such a simple method, the obtained macromolecular optical waveguide film has small conduction loss and high precision, and can be mounted in various devices.

Optical Transmission and Reception Section

Referring to FIGS. 6A to 6C and FIGS. 7A to 7C, a configuration of an optical transmission and reception section 12 having a sub-mount 22 is explained. As a sub-mount 24 is same as the sub-mount 22 in configuration and an optical transmission and reception section 14 is the same as the optical transmission and reception section 12 in configuration, the detailed description of the sub-mount 24 and the optical transmission and reception section 14 will be omitted.

Figure 6A:
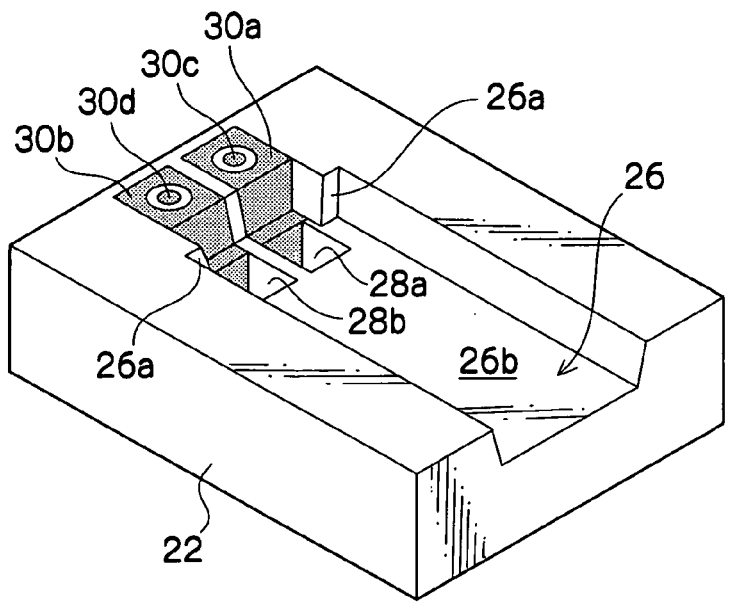
FIG. 6A is a perspective view of a sub-mount of the light transmission and reception module according to the present embodiment.
Figure 6B:
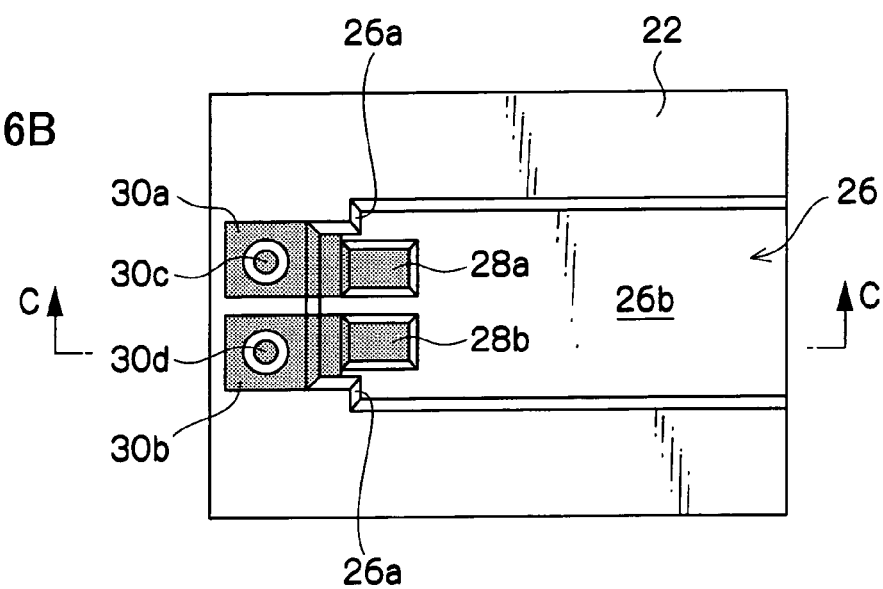
FIG. 6B is a plan view of the sub-mount of the light transmission and reception module according to the present embodiment.
Figure 6C:
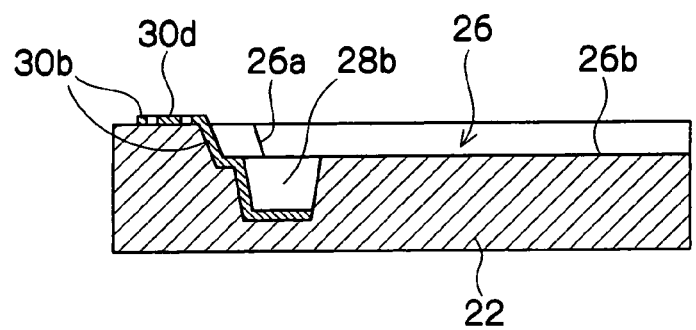
FIG. 6C is a sectional view taken along C-C of FIG. 6B.

First, referring to FIGS. 6A to 6C, the configuration of the sub-mount 22 is explained. FIG. 6A is a perspective view of the sub-mount 22, FIG. 6B is a plan view of the sub-mount 22, and FIG. 6C is a sectional view C-C of FIG. 6B.

The sub-mount 22 is made of a rectangular parallelepiped substrate. This sub-mount 22 has a recess 26 (a recess for mounting optical components) for mounting a macromolecular optical waveguide film 10, and recesses 28a and 28b (recesses for mounting optical components) for fitting and holding (mounting) a light detecting element and a light emitting element, respectively. In this embodiment, two recesses 28a and 28b are formed to mount the respective element, however, one recess may be formed to mount both of a light detecting element and a light emitting element. The recess 26 includes an applied surface 26a attached to the abutting surface 10a of the macromolecular optical waveguide film 10, and a mounting surface 26b for mounting a film surface 10c of the macromolecular optical waveguide film 10.

In each of the recesses 26, 28a, and 28b serving as recesses for mounting optical component, four or three side walls have tapered shape, and the opening is larger than the bottom surface. The side wall at the recess for mounting the optical component only needs to have at least two adjacent side walls of tapered shape.

In part of the surface of the sub-mount 22, electrode films 30a, 30b, 30c, 30d are formed for electrical wiring with the light detecting element and the light emitting element. In this example, the electrode films 30a, 30b are patterned so as to be extended to the top surface of the sub-mount 22 from the bottom surface of the recess 28 by way of the side surface.

The electrode films 30c, 30d are patterned on the top surface of the sub-mount 22 so as to be insulated from the electrode films 30a, 30b. By forming the electrode films at the sub-mount 22, electrical wiring is easily provided to the light detecting element and the light emitting element when installing the light transmission and reception module in a package.

The sub-mount 22 is produced at a high precision by the manufacturing method using the above-mentioned duplication method with the mold. The electrode films 30a, 30b, 30c, 30d are, for example, formed by vapor-depositing a metal film of gold (Au), aluminum (Al) or the like on the surface of sub-mount 22, and patterning this metal film by the technology of photolithography.

Figure 7A:
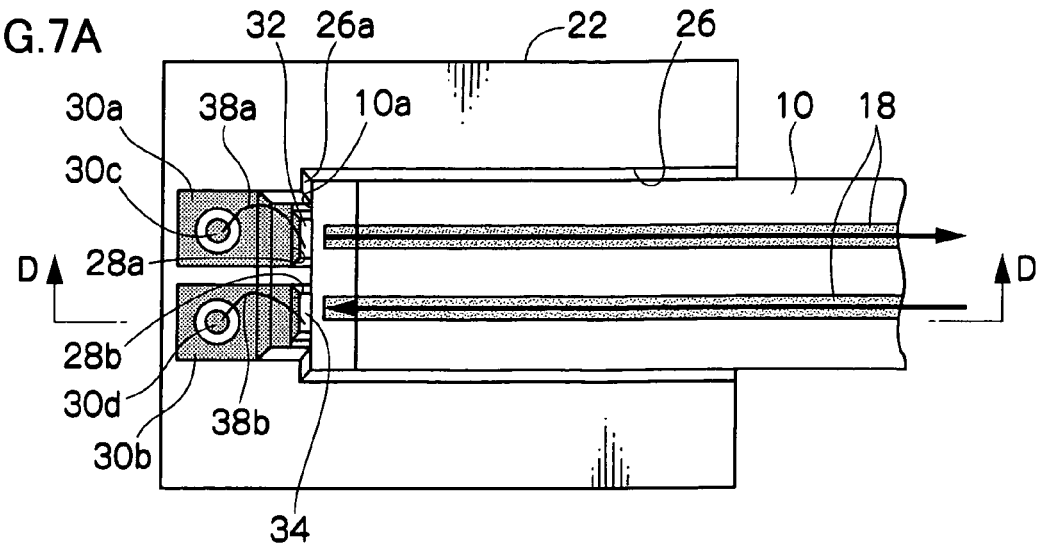
FIG. 7A is a plan view of an optical transmission and reception section of the light transmission and reception module according to the present embodiment.
Figure 7B:
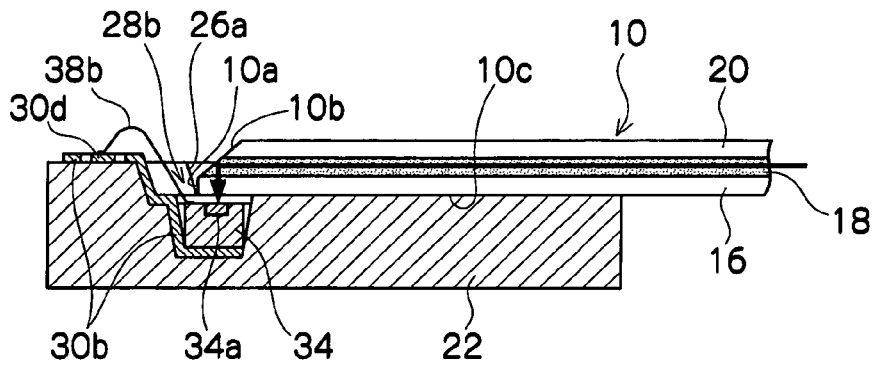
FIG. 7B is a sectional view taken along D-D of FIG. 7A.
Figure 7C:
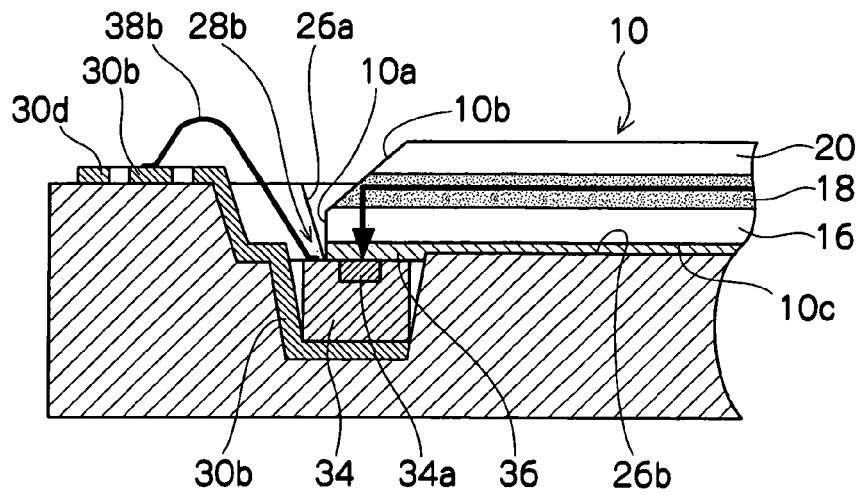
FIG. 7C is a partially magnified view showing an optical coupler in FIG. 7B.
Figure 9A:
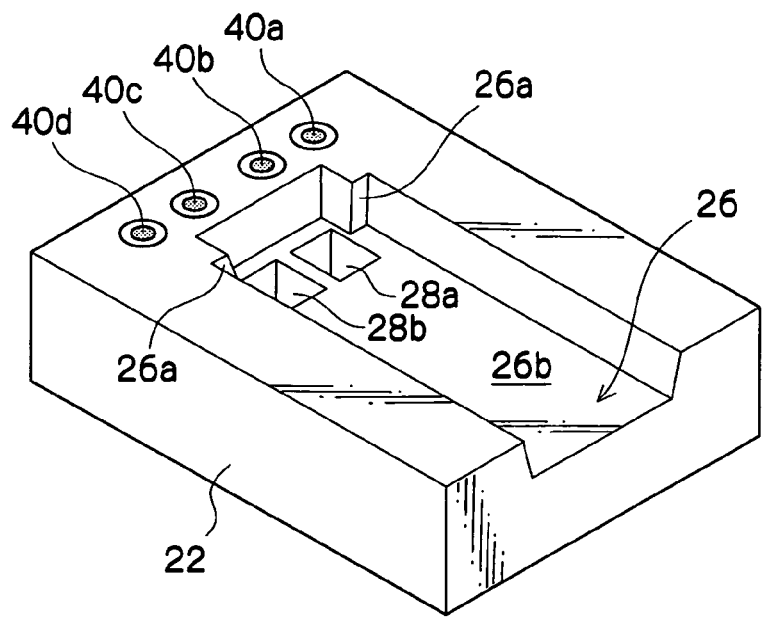
FIG. 9A is a perspective view of a sub-mount of another light transmission and reception module according to the present embodiment.
Figure 9B:
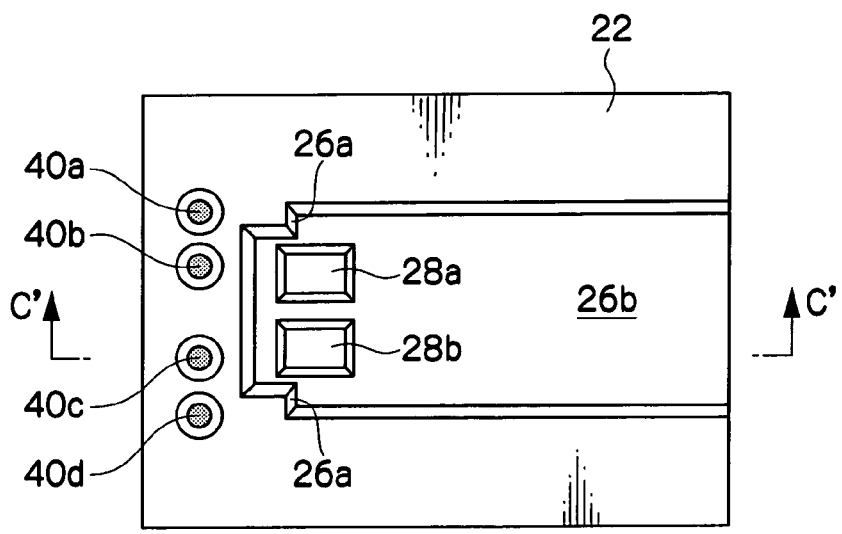
FIG. 9B is a plan view of the sub-mount of another light transmission and reception module according to the present embodiment.
Figure 9C:
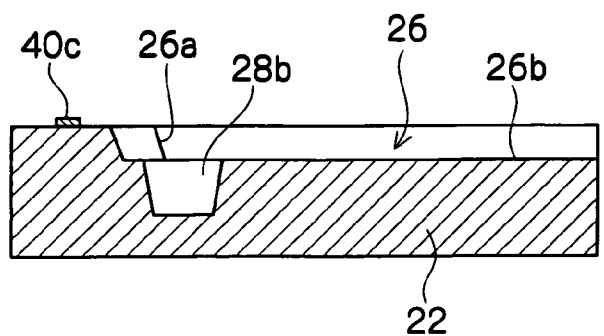
FIG. 9C is a sectional view taken along C-C of FIG. 9B.
Figure 10A:
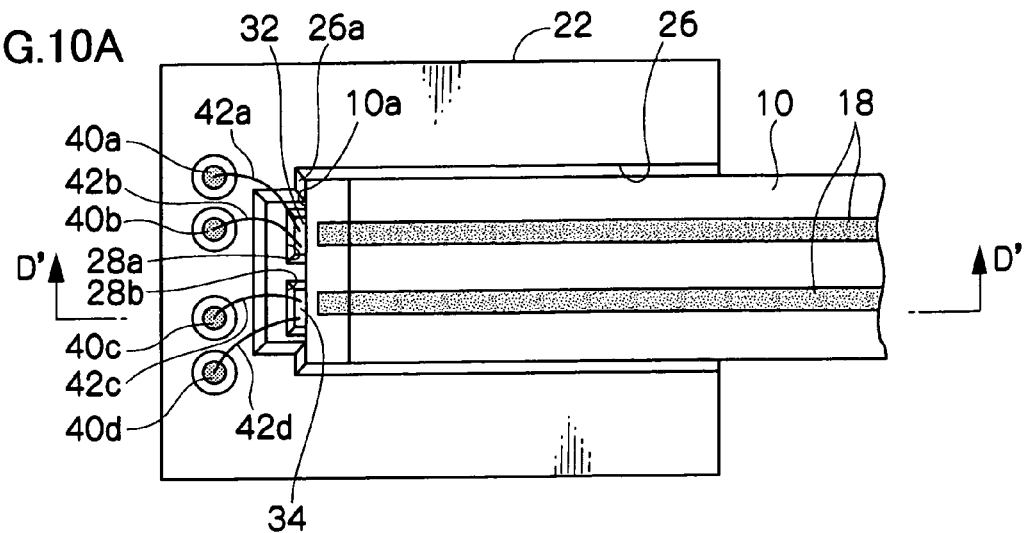
FIG. 10A is a plan view of an optical transmission and reception section of another light transmission and reception module according to the present embodiment.
Figure 10B:
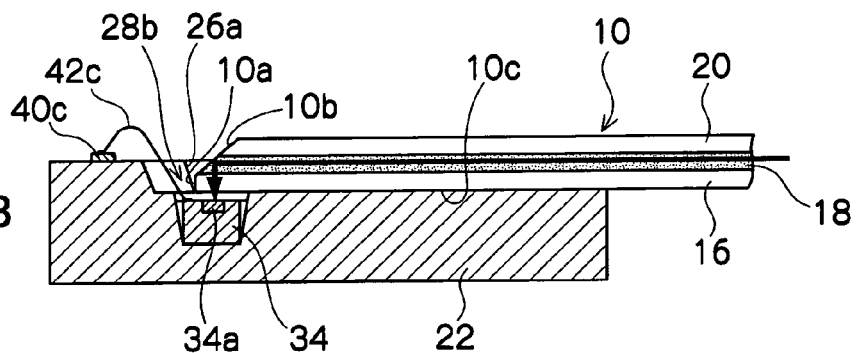
FIG. 10B is a cross sectional view taken along D-D of FIG. 10A.
Figure 10C:
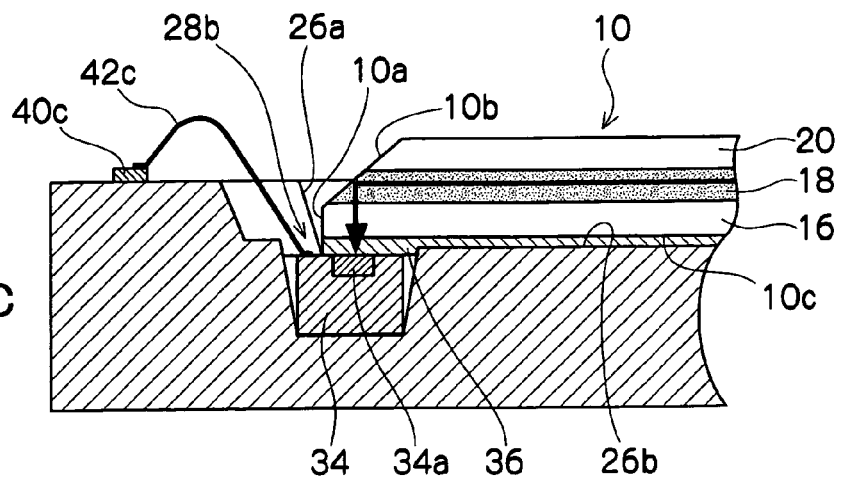
FIG. 10C is a partially magnified view showing an optical coupler of FIG. 10B.
Figure 11:
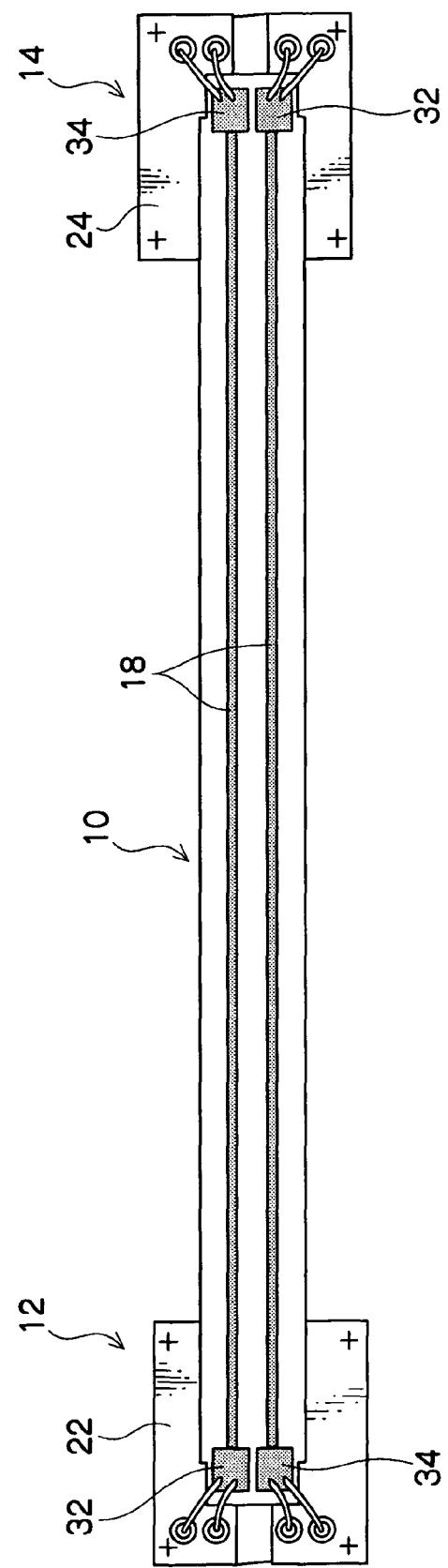
FIG. 11 is a view schematically showing a configuration of another light transmission and reception module according to the present embodiment.

Referring next to FIGS. 7A to 7C, a mounting state of an optical transmission and reception section 12 is explained.

FIG. 7A is a plan view of the optical transmission and reception section 12, FIG. 7B is a sectional view taken along D-D (sectional view along the optical axis of optical waveguide) of FIG. 7A, and FIG. 7C is a partially magnified view showing an optical coupler in FIG. 7B.

When mounting the light transmission and reception module, a surface emission type semiconductor laser diode (LD) 32 as the light emitting element, a photo diode (PD) 34 as the light detecting element, and the macromolecular optical waveguide film 10 are held on the sub-mount 22 of the optical transmission and reception section 12.

The end of the macromolecular optical waveguide film 10 is fitted into the recess 26 of the sub-mount 22. The abutting surface 10a abuts against the applied surface 26a of the sub-mount 22 and is positioned at specified location. The film surface 10c of the light incident and exit side is mounted on the sub-mount 22 so as to oppose to the mounting surface 26b of the sub-mount 22. Thus, holding the macromolecular optical waveguide film 10 on the mounting surface 26b, the flexible macromolecular optical waveguide film 10 can be held stably.

The film surface 10c is adhered to the opposing mounting surfaces 26b, LD 32 and PD 34 by means of adhesive 36. The adhesive 36 may be photosetting adhesive such as ultraviolet curable resin, or thermosetting resin, but in order to reduce the optical loss, it is preferable to use the same curable resin as used in the cladding 16 of the macromolecular optical waveguide film 10.

Since the side walls of the recess 26 have tapered shapes, and the opening is larger than the bottom surface (mounting surface), the macromolecular optical waveguide film 10 can be easily fitted into the recess 26, and positioning precision is increased.

The LD 32 and the PD 34 are fitted in the recesses 28a and 28b of the sub-mount 22, respectively and are fixed at the bottom surface of the recesses 28a and 28b. By fitting the LD 32 and the PD 34 in the recesses 28a and 28b, the optical transmission and reception section 12 is made compact. In this example, the electrode films 30a and 30b are formed in the bottom surfaces of the recesses 28a and 28b. Therefore, the back electrode of the LD 32 and the electrode film 30a, and the back electrode of the PD 34 and the electrode film 30b are fixed at the bottom surfaces of the recesses 28a and 28b by conductive solder (electroconductive paste) or the like so as to conduct with each other electrically.

The other electrode of LD 32 is electrically connected to the electrode film 30c by wire 38a, and the other electrode of PD 34 is electrically connected to the electrode film 30d by wire 38b. As shown in FIGS. 7B and 7C, the photo diode 34 is fitted and held in recess 28b below the mounting surface 26b. The laser diode 32 is similarly fitted and held in recess 28a.

Since the side walls of the recesses 28a and 28b have tapered shapes, and the openings are larger than the bottom surfaces (mounting surfaces), the LD 32 and PD 34 are easily fitted into the recesses 28a and 28b, and positioning precision is increased.

The LD 32 and PD 34 are disposed at specified positions, depending on the abutting position of the abutting surface 10a, so that the emitter 32a of the LD 32 is opposite to the end surface (incident end surface) of the core 18 of the optical waveguide for transmission of macromolecular optical waveguide film 10, and that the detector 34a of the PD 34 is opposite to the end surface (exit end surface) of the core 18 of optical waveguide for reception of macromolecular optical waveguide film 10.

Herein, the optical waveguide for transmitting an optical signal from the optical transmission and reception section 12 is described as the optical waveguide for transmission, and the optical waveguide for receiving an optical signal from the optical transmission and reception section 12 is described as the optical waveguide for reception. As seen from the optical transmission and reception section 14, needless to say, the optical waveguide for transmission and optical waveguide for reception are inverted.

The optical transmission and reception section 12 can be assembled easily, by fitting the LD 32 and PD 34 in the recesses 28a and 28b of the sub-mount 22 and fitting the macromolecular optical waveguide film 10 in the recess 26 of the sub-mount 22.

In this embodiment, the macromolecular optical waveguide film 10 is composed of a transparent resin, and the position of end of the core 18 of the optical waveguide can be observed through back surface reflection of the mirror 10b. Therefore, by using the back surface reflection image on the mirror 10b, alignments of LD 32 and PD 34 become easy to be mounted in high precision by passive alignment.

Operation of Light Transmission and Reception Module

Referring to FIG. 8, the operation of the light transmission and reception module of the embodiment is explained. FIG. 8 is a view schematically showing a structure of light transmission and reception module. Herein, the optical waveguide for transmitting an optical signal from the optical transmission and reception section 12 is designated as the optical waveguide for transmission, and the optical waveguide for receiving an optical signal from the optical transmission and reception section 12 is designated as the optical waveguide for reception.

In the light transmission and reception module of the embodiment, when transmitting an optical signal from the optical transmission and reception section 12 to the optical transmission and reception section 14, the light emitted from the LD 32 held on the sub-mount 22 of the optical transmission and reception section 12 is coupled to the incident end surface of the core 18 of the optical waveguide for transmission, and is guided in the optical waveguide for transmission formed in the macromolecular optical waveguide film 10. The light emitted from the exit end surface of the core 18 of the optical waveguide for transmission is received in the PD 34 held in the sub-mount 24 of the optical transmission and reception section 14.

Similarly, when receiving an optical signal transmitted from the optical transmission and reception section 14 by the optical transmission and reception section 12, the light emitted from the LD 32 held in the sub-mount 24 of the optical transmission and reception section 14 is coupled to the incident end surface of the core 18 of the optical waveguide for reception, and is guided in the optical waveguide for reception formed in the macromolecular optical waveguide film 10. The light emitted from the exit end surface of the core 18 of optical waveguide for reception is received in the PD 34 held in the sub-mount 22 of the optical transmission and reception section 12.

As explained above, in the light transmission and reception module of the embodiment, two way light communications are performed between a set of optical transmission and reception sections as mentioned above. The flexible belt-shaped macromolecular optical waveguide film has a property of following up the deformation such as bending, folding or twisting, so that even if the film is deformed, optical signal can be transmitted and received by way of the optical waveguide formed in the macromolecular optical waveguide film. Therefore, it can be used in optical wiring of often-bent-or-folded connection of cellphone, slim personal computer or other mobile appliance.

In the light transmission and reception module of the embodiment, since the electrode film is formed in the sub-mount, when installing the light transmission and reception module in a package, electrical wiring can be easily provided in the light detecting element and in the light emitting element of the optical transmission and reception section.

In the light transmission and reception module of the embodiment, since the sub-mount includes recesses 26, 28*a*, 28*b* serving as recesses for mounting optical components whose side walls have tapered shapes and whose openings are larger than the bottom surfaces, the macromolecular optical waveguide film 10, the LD 32, and the PD 34 are easily and reliably mounted on the sub-mount 22 at high precision, as described above.

Further, in the light transmission and reception module of the embodiment, since the sub-mount processed into a predetermined shape is used, mounting of the macromolecular optical waveguide film, the light emitting element and the light detecting element are facilitated, as described in (1) to (4) below.

(1) Since the recess including the mounting surface on which the end portion of the macromolecular waveguide film is mounted is formed in the sub-mount, and the macromolecular waveguide film is held on a plane by the mounting surface, the flexible macromolecular waveguide film can be stably held on the sub-mount.

(2) Since the abutting surface for positioning is formed on the end surface of the macromolecular optical waveguide film and the recess including the applied surface to which the abutting surface is attached is formed in the sub-mount, the macromolecular optical waveguide film can be easily mounted by fitting the abutting surface and the applied surface.

(3) Since the recesses for holding the light emitting element and the light detecting element are formed in the sub-mount, the light emitting element and the light detecting element are easily mounted by simply fitting these elements into the recess, and the optical transmission and reception section can be made compact.

(4) Normally, if a 45° cut is formed on the macromolecular optical waveguide, the light is totally reflected, and it is difficult to check the position of the core of the waveguide path through observation of the reflected light or the transmitted light. Therefore, alignment of the position of the 45° plane of the core of the waveguide path and the light detecting/emitting element becomes difficult, and thus must rely on active alignment. In contrast thereto, in the present embodiment, since a transparent macromolecular optical waveguide film is used, the position of the 45° plane of the core of the waveguide path can be observed by the back reflected image, and the light emitting element and the light detecting element can be mounted at satisfactory precision in a passive alignment by using the back reflected image.

Another Arrangement of Electrode

In the above embodiments, a case of forming the electrode film extending from the bottom surface of the recess formed in the sub-mount through the side surface to the top surface of the sub-mount and electrically conducting the back electrodes of the LD and the PD and the electrode films is explained, but the formed pattern of the electrode film is not limited thereto.

For instance, as shown in FIGS. 9A to 9C, FIGS. 10A to 10C, and FIG. 11, the electrode films 40*a*, 40*b*, 40*c* and 40*d* insulated with respect to each other may be formed on the upper surface of the sub-mount 22. In mounting the light transmission and reception module, the electrode films 40*a* and 40*b* and each electrode of the LD 32 may be electrically connected with wires 42*a* and 42*b*, and the electrode films 40*c* and 40*d* and each electrode of the PD 34 may be electrically connected with wires 42*c* and 42*d*. Other configurations are the same as the above embodiments.

Another Configuration of Modules

In the embodiment, it is explained that the light transmission and reception module of two way optical communications having the light transmission and reception sections respectively mounted with both the light emitting element and the light detecting element. However, the light transmission and reception module may be one way type which is constituted with a light transmission section having a light emitting element and a light reception section having a light detecting element.

EXAMPLE

The invention is more specifically described below by referring to an example, but the invention is not limited to the example alone.

An example of producing a mold from a master mold (a master plate) using silicone resin, duplicating a sub-mount using epoxy resin of UV curing type, and producing a light transmission and reception module is given. A recess having a tapered side wall is referred to as "tapered recess".

(Production of Macromolecule Optical Waveguide Film)

After an Si substrate is coated with a thick film resist (trade name: SU-8, manufactured by Microchemical) according to a spin coat method, it is prebaked at 80 deg. C., is exposed through a photomask and is developed so that four projections respectively having a quadrate section (width: 50 μm, height: 50 μm, length: 80 mm) are formed. Each gap between the projections is set to 250 μm. The Si substrate coated with the thick film resist is post-baked at 120 deg. C., so that a master plate for manufacturing a macromolecular waveguide is produced.

A releasing agent is applied on the master plate, and a mixture of thermosetting liquid dimethyl siloxane rubber (SYLGARD184 of Dow-Coming Asia, viscosity 5000 mPa·s) and its hardening agent is poured in, and heated and cured for 30 minutes at 120 deg. C. After releasing, a die (die thickness: 5 mm) having recesses corresponding to the projections of rectangular sections is produced.

Further, through-holes of circular top view, having a section tapered in mold thickness direction are formed by punching to communicate with the recesses at both ends of each recess, whereby a mold is produced.

This mold is adhered tightly to a film base material for cladding (Arton Film of JSR Co., refractive index 1.510) of film thickness of 50 μm, which is one size larger than the mold.

A few drops of ultraviolet curable resin of viscosity of 500 mPa·s are dropped into supply side through-holes of the mold, and the discharge side (i.e., the evacuating and sucking side) through-holes are evacuated and sucked, such that the recesses are filled with the ultraviolet curable resin in 10 minutes. They are cured by emitting ultraviolet light of 50 mW/cm$^2$ irradiated from outside of the mold for 5 minutes, and the mold is separated from Arton Film, whereby cores of same shapes as projecting portions of the master plate are formed on the Arton Film.

Next, after applying the ultraviolet curable resin having a refraction index after curing of 1.510, same as that of Arton film, on the core formed surface of the Arton film, a film base material for a cladding of 50 μm is laminated. The UV light of 50 mW/cm² is irradiated for five minutes for ultraviolet curing to bond the two films to form a belt shaped macromolecular optical waveguide film having a width of 1.5 mm and a film thickness of 180 μm.

Using a dicing saw with a Si blade angled by 45 degrees, both ends of this macromolecular optical waveguide film are cut off at an angle of 45 degrees with respect to the optical axis, such that each core having a 45-degree mirror surface is exposed. Each cladding portion of the 45-degree mirror surfaces is cut off vertically to the optical axis at a position of 50 μm inside from the leading end, and a macromolecular optical waveguide film having 45-degree mirror surfaces and vertical cut sections at both ends is obtained.

(Production of Sub-mount)

On Si substrate of 600 μm in thickness, two recesses for mounting a light emitting element and a light detecting element are formed with anisotropic etching using a photo-resist and TMAH. The depth of each recess is 250 μm. Further, to mount the macromolecular optical waveguide film, a recess of 50 μm in depth having an applied surface opposing to the vertical cut section of the macromolecular optical waveguide film is formed by anisotropic etching. The Si master substrate having the recesses is prepared as a master plate of the sub-mount. In this master plate, recesses for a plurality of sub-mounts are formed and by using this master plate, a plurality of sub-mounts can be reproduced simultaneously.

On this master plate, a mixture of thermosetting liquid dimethyl siloxane rubber (SYLGARD184 of Dow-Corning Asia, viscosity 5000 mPa·s) and its hardening agent is poured in, and heated and cured for 30 minutes at 120 deg. C. After releasing the cured layer, a silicone resin mold (die thickness: 5 mm) having projections and recesses corresponding to the projections and recesses of the master plate on its surface is produced.

Ultraviolet curable resin (of NTT-AT) with viscosity of 3000 mPa·s is applied, and ultraviolet light of 50 mW/cm² is irradiated from outside of the mold for 5 minutes to cure, and the cured resin layer is released from the mold. After vapor-depositing Au in a thickness of 200 nm on the cured resin layer, the Au electrodes are patterned by photolithography, whereby electrode pads for lower electrodes extending from a bottom surface to a side surface of each recess up to a top surface of the sub-mount, and electrode pads for upper electrodes insulated from the electrode pads for lower electrodes are formed. By cutting the cured resin layer having electrode pads by using a dicer, a plurality of sub-mounts A made of ultraviolet curable resin are formed.

Dimensional difference of projections and recesses as seen from the master substrate is within 100 nm, and sub-mounts A made of ultraviolet curable resin can be produced at high precision.

(Mounting of Module)

The VCSEL element (manufactured by Fuji Xerox Co., Ltd.) is placed on the recess for the light emitting element of the sub-mount A by way of the Sn—Au solder. The photodiode element is placed in the recess for the light detecting element by way of the Sn—Au solder. They are heated to 250° C. to fix the VCSEL element and the photodiode element, respectively, in the predetermined recess of the sub-mount A. Thus, the lower electrodes of each of the VCSEL element and the photodiode element are electrically connected with the electrode pads. Thereafter, the upper electrode of the VCSEL element and the electrode pad, as well as the upper electrode of the photodiode element and the electrode pad are bonded using an Au wire.

Both ends of the macromolecular optical waveguide film having 45-degree mirrors are respectively fitted into the recess of the sub-mount A, the vertical cut section is positioned by abutting against the applied surface of the sub-mount A, and macromolecular optical waveguide film is fixed to sub-mount A by using ultraviolet curing agent (adhesive). As a result, a two-way light transmission and reception module of the example having a pair of optical transmission and reception sections and macromolecular optical waveguide film is obtained.

(Evaluation of Communication Performance)

Light transmission and reception performance of a two-way light transmission and reception module which is obtained according to the example was evaluated by using a sampling oscilloscope (product name: Agilent 86100C, manufactured by Agilent Technologies) and a pulse pattern generator. As a result, satisfactory eye pattern could be measured at up to 3.125 Gbps.

The above embodiment of the present invention provides an example of a sub-mount, a production method thereof, and a light transmission and reception module having the sub-mount; however, the present invention is not limited to the embodiment, but various modifications can be made. It is obvious for the skilled person in the art that such modifications are also included in the scope of the invention.

The sub-mount of the invention may have a recess for mounting with at least two adjacent side walls having tapered shape.

A side wall of a recess for mounting may have tapered shape so that the area of an opening is larger than the area of a bottom surface of the recess for mounting.

According to the above shape of the sub-mount, optical components are easily and reliably mounted in the sub-mount at satisfactory precision.

The sub-mount of the invention is manufactured by producing the mold for duplication formed with projections and recesses including the recess for mounting in order to copy the surface configuration of the sub-mount, filling the curable material into the produced mold for duplication, curing the curable material and separating the copied sub-mount from the mold for duplication.

The mold for duplication is manufactured by performing anisotropic etching on a silicon monocrystal substrate having a (100) plane cut out on a surface, producing a master mold formed with projections and recesses including the recess for mounting, applying or pouring liquid silicone rubber into the produced master mold, curing the liquid silicone rubber, and separating the formed mold for duplication from the master mold, In this manufacturing method, since anisotropic etching is performed on the silicon (100) substrate, the projections and recesses corresponding to the recess for embedding having a tapered side wall in the sub-mount can be easily formed in the master mold. The mold for duplication is formed by curing the liquid silicone rubber in the master mold, and thus the surface configuration of the sub-mount is copied to the mold at satisfactory precision. A sub-mount is thereby accurately duplicated. Further, the sub-mount is produced in large quantities at a low cost.

The heat resistant resin, the light curable heat resistant resin, thermoplastic heat resistant resin and the like may be applied as the curable material. The epoxy resin, polyimide resin and the like may be applied as the heat resistant resin.

As explained above, the sub-mount of the invention is precise and allows easy and reliable mounting of optical components at satisfactory precision, excels in mass production, and is inexpensive. Further, the light transmission and reception module of the invention includes the sub-mount of the invention, and thus optical elements serving as optical components and the optical waveguide film are easily and reliably mounted to the sub-mount at high precision. The light transmission and reception module of the invention is also excel in mass production with a low cost. Further, according to the manufacturing method of the sub-mount of the invention, the sub-mount maintaining the shape at high precision can be produced.

What is claimed is:

1. A sub-mount for mounting an optical component comprising:
    an upper planar surface;
    a first recess for embedding and mounting the optical component comprising at least one of a light emitting element and a light detecting element, and an optical waveguide film, the first recess being recessed in a first direction with respect to the upper planar surface and having a mounting surface on which the optical waveguide film is mounted, the mounting surface being formed in a bottom surface of the first recess, and the first recess having one or more side walls, at least one of the side walls being tapered; and
    a second recess formed in the mounting surface of the first recess and recessed in the first direction from the mounting surface, the second recess fitting and holding the at least one of the light detecting element and the light emitting element below the bottom surface of the first recess.

2. The sub-mount for mounting an optical component according to claim 1, wherein the one or more side walls comprise at least two adjacent side walls that are tapered.

3. The sub-mount for mounting an optical component according to claim 1, wherein the at least one side wall is tapered so that the area of an opening is greater than the area of the bottom surface of the first recess that serves as the mounting surface.

4. The sub-mount for mounting an optical component according to claim 1, wherein the sub-mount is manufactured by producing a mold for duplication formed with projections and recesses including the first recess and the second recess in order to copy a surface configuration of the sub-mount, filling the produced mold for duplication with curable material, curing the curable material, and separating the copied sub-mount from the mold for duplication.

5. The sub-mount for mounting an optical component according to claim 4, wherein the mold for duplication is manufactured by performing anisotropic etching on a silicon monocrystal substrate having a (100) plane cut out on a surface, producing a master mold formed with projections and recesses including the first recess and the second recess, applying or pouring liquid silicone rubber into the produced master mold, curing the liquid silicone rubber, and separating a formed mold for duplication from the master mold.

6. The sub-mount for mounting an optical component according to claim 4, wherein the curable material is heat resistant resin.

7. The sub-mount for mounting an optical component according to claim 4, wherein the curable material is light curable heat resistant resin.

8. The sub-mount for mounting an optical component according to claim 4, wherein the curable material is thermoplastic heat resistant resin.

9. The sub-mount for mounting an optical component according to claim 6, wherein the heat resistant resin is epoxy resin or polyimide resin.

10. A light transmission and reception module, comprising:
    an optical waveguide film formed with an optical waveguide;
    a light transmitting section having a light emitting element and a sub-mount for holding the light emitting element, and holding one end of the optical waveguide film on the sub-mount so that light emitted from the light emitting element is coupled with an incident end surface of the optical waveguide; and
    a light detecting section having a light detecting element and a sub-mount for holding the light detecting element, and holding the other end of the optical waveguide film on the sub-mount so that light emitted from an emission end surface of the optical waveguide is detected by the light detecting element; wherein,
    each sub-mount includes:
        an upper planar surface
        a first recess for embedding and mounting the corresponding one of the light emitting element and the light detecting element, and the optical waveguide film, the first recess being recessed in a first direction with respect to the upper planar surface and having a mounting surface on which the optical waveguide film is mounted, the mounting surface being formed in a bottom surface of the first recess, and the first recess having one or more side walls, at least one of the side walls being tapered; and
        a second recess formed in the mounting surface of the first recess and recessed in the first direction from the mounting surface, the second recess fitting and holding the corresponding one of the light detecting element and the light emitting element below the bottom surface of the first recess.

11. A manufacturing method of a sub-mount for mounting an optical component including at least one of a light emitting element and a light detecting element, and an optical waveguide film, and the sub-mount having an upper planar surface, the method comprising:
    producing a mold for duplication by making a master mold of the sub-mount by forming projections and recesses including a first recess and a second recess by performing anisotropic etching on a silicon monocrystal substrate having a plane cut out on a surface, applying or pouring liquid silicone rubber into the master mold, and separating the cured silicone rubber from the master mold;
    filling a curable material into the mold for duplication;
    curing the filled curable material; and
    separating the cured curable material from the mold for duplication, wherein
    the first recess is recessed in a first direction with respect to the upper planar surface and has a mounting surface on which the optical waveguide film is mounted, the mounting surface being formed in a bottom surface of the first recess, and the first recess further has one or more side walls, and
    a second recess formed in the mounting surface of the first recess and recessed in the first direction from the mounting surface, the second recess fits and holds the at least one of the light detecting element and the light emitting element below the bottom surface of the first recess.

12. The manufacturing method of a sub-mount for mounting an optical component according to claim 11, wherein at least one side wall is tapered.

13. The manufacturing method of a sub-mount for mounting optical component according to claim 11, wherein the one or more side walls include at least two adjacent side walls that are tapered.

14. The manufacturing method of a sub-mount for mounting an optical component according to claim 12, wherein at least one side wall is tapered so that the area of an opening is greater than the area of the bottom surface of the first recess that serves as the mounting surface.

15. The manufacturing method of a sub-mount for mounting an optical component according to claim 11, wherein the curable material is heat resistant resin.

16. The manufacturing method of a sub-mount for mounting an optical component according to claim 11, wherein the curable material is light curable heat resistant resin.

17. The manufacturing method of a sub-mount for mounting an optical component according to claim 11, wherein the curable material is thermoplastic heat resistant resin.

18. The manufacturing method of a sub-mount for mounting an optical component according to claim 15, wherein the heat resistant resin is epoxy resin or polyimide resin.

19. The sub-mount for mounting an optical component according to claim 1, wherein the second recess has a bottom surface and a side wall, a electrode film to connect to at least one of the light detecting element and the light emitting element is disposed on the bottom surface and the side wall, the bottom surface and the side wall of the second recess are different from the bottom surface and the one or more side walls of the first recess.

20. The light transmission and reception module according to claim 10, wherein the second recess has a bottom surface and a side wall, a electrode film to connect to at least one of the light detecting element and the light emitting element is disposed on the bottom surface and the side wall, the bottom surface and the side wall of the second recess are different from the bottom surface and the one or more side walls of the first recess.

21. The manufacturing method of a sub-mount for mounting an optical component according to claim 11, wherein the second recess has a bottom surface and a side wall, a electrode film to connect to at least one of the light detecting element and the light emitting element is disposed on the bottom surface and the side wall, the bottom surface and the side wall of the second recess are different from the bottom surface and the one or more side walls of the first recess.

22. The sub-mount for mounting an optical component according to claim 1, wherein the optical waveguide film includes an abutting surface and the first recess includes an applied surface attached to the abutting surface.

23. The light transmission and reception module according to claim 10, wherein the optical waveguide film includes an abutting surface and the first recess includes an applied surface attached to the abutting surface.

24. The manufacturing method of a sub-mount for mounting an optical component according to claim 11, wherein the optical waveguide film includes an abutting surface and the first recess includes an applied surface attached to the abutting surface.

* * * * *